United States Patent [19]

Streeter

[11] 4,344,038
[45] Aug. 10, 1982

[54] LOW FREQUENCY TONE DETECTOR
[75] Inventor: Robert D. Streeter, Fort Wayne, Ind.
[73] Assignee: The Magnavox Company, New York, N.Y.
[21] Appl. No.: 153,813
[22] Filed: May 27, 1980
[51] Int. Cl.³ .............................................. H03K 5/26
[52] U.S. Cl. ....................................... 328/138; 375/87; 179/1 GS; 307/523
[58] Field of Search ..................... 328/138; 375/90, 87; 179/1 GS, 1 GN; 329/122; 307/522, 523

[56] References Cited

U.S. PATENT DOCUMENTS

| | | | |
|---|---|---|---|
| 3,825,842 | 7/1974 | Birchfield et al. | 328/138 |
| 3,958,183 | 5/1976 | Schaefer | 328/138 |
| 3,962,645 | 6/1976 | Stewart | 328/138 X |
| 4,232,267 | 11/1980 | Hanajima et al. | 328/138 |
| 4,249,038 | 2/1981 | Stienstra | 179/1 GD |
| 4,266,198 | 5/1981 | Spada | 375/87 |

OTHER PUBLICATIONS

Radio Electronics Dec. 1977, pp. 51–53, "Broadcast Systems for AM Stereo" by Feldman.

*Primary Examiner*—John S. Heyman
*Attorney, Agent, or Firm*—Thomas A. Briody; Robert T. Mayer

[57] ABSTRACT

A digital detector for a 5 Hz signal is combined with a detector for Manchester encoded data with a frequency of 2.5 Hz. The preferred apparatus includes a signal generating means in the form of an oscillator which generates a signal of a known frequency higher than that of the 5 Hz signal. This oscillator is connected to a frequency responsive means and to the circuit in which 2.5 Hz and 5 Hz signals are to be detected. The frequency responsive means produces an output signal in response to the generation of a given number of cycles of said higher frequency signal during one half of any cycle of said predetermined low frequency signals. Also connected to the frequency responsive means and to the circuit in which the predetermined low frequency signals are to be detected is a detection signal means. This produces a detection signal in response to the reception of an output signal from the frequency responsive means and a signal indicating the end of a half cycle of either the 2.5 Hz or 5 Hz signal.

8 Claims, 1 Drawing Figure

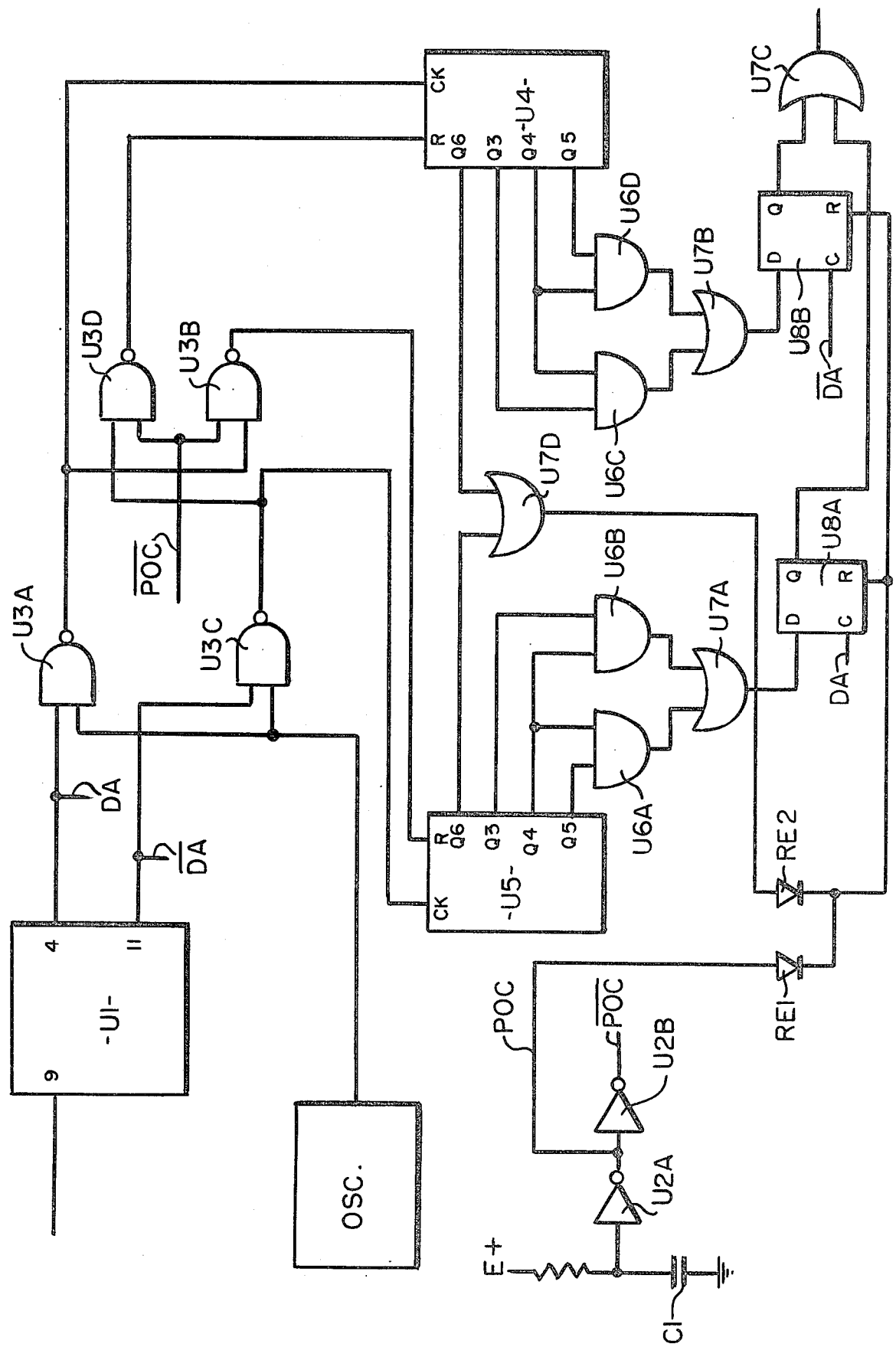

LOW FREQUENCY TONE DETECTOR

This invention relates to a tone detector for low frequency signals.

It is expected that AM Stereo broadcasts will carry a 5 Hz pilot signal. This will be used to identify the broadcast as being AM Stereo. It can also be used in radio receivers which have the ability to search for and tune in such broadcasts automatically such as in some automotive radio receivers. A fast acting, inexpensive, efficient detector for this low frequency signal is disclosed herein.

Previous arrangements for recognizing a 5 Hz tone employed bandpass filters and half and full wave rectifiers. It is an object of this invention to provide a low frequency tone detector comprising digital circuitry.

An advantage of the invention is that it can detect the low frequency signal during both halves of its cycles.

One of the features of the invention is its capability of detecting Manchester encoded data as well as a 5 Hz tone.

In accordance with the invention there is provided apparatus for detecting the presence of a predetermined low frequency signal in a circuit. The preferred apparatus includes a signal generating means in the form of an oscillator which generates a signal of a known frequency higher than that of the predetermined low frequency signal. This oscillator is connected to a frequency responsive means and to the circuit in which the predetermined low frequency signal is to be detected. The frequency responsive means produces an output signal in response to the generation of a given number of cycles of said higher frequency signal during one-half of any cycle of said predetermined low frequency signal. Also connected to the frequency responsive means and to the circuit in which the predetermined low frequency signal is to be detected is a detection signal means. This produces a detection signal in response to the reception of an output signal from the frequency responsive means and a signal indicating the end of any half cycle of the predetermined low frequency signal.

Other objects, features and advantages of the invention will be apparent to those skilled in the art from the following description and appended claims when considered in conjunction with the accompanying drawings, in which:

The sole FIGURE is a wiring diagram of the presently preferred embodiment.

As shown in the drawing, an input circuit is connected to pin 9 of a dual Schmitt trigger U1 which in the presently preferred embodiment is a Motorola-type MC14583B. The pin 4 output of this trigger circuit is connected to one input of a two input NAND circuit U3A. The pin 11 output of the trigger circuit is connected to one input of a second two input NAND gate U3C. The other input of each of these NAND gates is connected to the output of an oscillator circuit OSC which produces an output signal with a frequency of 133.3 HERTZ. The outputs of these NAND gates U3A and U3C are connected to the clock inputs of counters U4 and U5, respectively. These outputs are also connected to the inputs of two input NAND gates U3B and U3D, respectively. The other input of each of these NAND gates U3B and U3D is connected along line $\overline{POC}$ to the output of two HEX inverter buffers U2A and U2B. The outputs of NAND gates U3B and U3D are connected to the reset inputs of counters U5 and U4, respectively.

Counters U4 and U5 in the preferred embodiment are Motorola-type MC14024B counters. The Q3 and Q4 outputs of counter U4 are connected to the two inputs of AND gate U6C. Outputs Q4 and Q5 of counter U4 are connected to the two inputs of AND gate U6D. Each of these AND gates U6C and U6D has its output connected to one of the two inputs of OR gate U7B. The output of this OR gate is connected to the D input of a type D flipflop or multivibrator U8B which in the preferred embodiment is a Motorola-type MC14013B.

The Q3 and Q4 outputs of counter U5 are connected to the two inputs of AND gate U6B. The Q4 and Q5 outputs of counter U5 are connected to the two inputs of AND gate U6A. The outputs of AND gates U6A and U6B are connected to the two inputs of OR gate U7A. The output of this OR gate is connected to the D input of type D flipflop or multivibrator U8A which in the preferred embodiment is of the Motorola-type MC14013B.

The Q6 outputs of counters U4 and U5 are connected to the two inputs of OR gate U7D. The output of this gate is connected through diode RE2 of the reset inputs of flipflops U8A and U8B. These reset inputs are also connected through rectifier RE1 to the output of HEX buffer U2A.

The clock input of flipflop U8A is connected along line DA to the pin 4 output of Schmitt trigger U1.

NAND gates U3A, U3B, U3C and U3D, counters U4 and U5, AND gates U6A, U6B, U6C and U6D and OR gates U7A and U7B comprise what is herein referred to as frequency responsive means. Flipflops U8A and U8B and OR gate U7C comprise the detection signal means.

The clock input of flipflop U8B is connected along line $\overline{DA}$ to the pin 11 output of Schmitt trigger U1. The Q outputs of flipflops U8A and U8B are connected to the two inputs of OR gate U7C.

In practicing the invention the circuitry shown on the drawing is included in a radio receiver and whenever power is turned on voltage E+ is applied to HEX inverter buffer U2A. This produces a nominal 20 millisecond binary 1 pulse along line POC to reset flipflops U8A and U8B causing binary zero signals to be generated from their Q outputs. At the end of the 20 millisecond period condenser C1 charges to voltage E+ and the binary zero on line $\overline{POC}$ changes to a binary one while the binary one on line POC changes to a binary zero. This enables NAND gates U3B and U3D to operate when binary 1 signals are applied to their other inputs.

Upon the receiver being tuned to a station transmitting a 5 Hz signal, this will be applied along the input line to input pin 9 of the Schmitt trigger U1. A binary 1 appears at output pin 4 during positive half cycles and at output pin 11 during negative half cycles. A binary 1 pulse will be produced by NAND gate U3A for each cycle of the 133.3 Hz signal produced by oscillator OSC during positive half cycles of the 5 Hz signal. Since the circuitry for negative half cycles is the same as that for positive half cycles this description will be limited to operation during a positive half cycle, it being understood that operation during a negative half cycle is similar.

Each binary 1 pulse from NAND gate U3A is applied to NAND gate U3B which in response applies a binary 1 pulse to the reset input R of counter U5 to reset that counter. In addition each binary 1 pulse from NAND gate U3A is also applied to the clock input CK of counter U4 for purposes of being counted. At the end of the positive half cycle one hundred milliseconds will have elapsed and depending upon race conditions in the circuits thirteen or fourteen pulses of the 133.3 Hz signal is counted. Consequently, binary 1 signals are produced from both the Q3 and Q4 outputs of counter U4. Actually, binary 1 signals are produced from Q3 and Q4 whether twelve, thirteen, fourteen or fifteen pulses are counted. These binary 1 signals produce a binary 1 signal from AND gate U6C which causes OR gate U7B also to produce a binary 1 signal. This is applied to the D input of flipflop U8B.

Schmitt trigger U1 produces a binary 1 output from output pin 11 along line DA in response to the 5 Hz signal applied to input pin 9 going through zero between half cycles. This is applied to the clock input of flipflop U8B causing it to produce a binary 1 output from its Q output. As a result OR gate U7C produces a binary 1 signal at its output also. This detection signal indicates the presence of the 5 Hz signal during its last positive half cycle.

The binary 1 signal along line $\overline{DA}$ also causes NAND gates U3C and U3D to produce a binary 1 signal at the reset input R of counter U4 upon the next pulse from oscillator OSC. This is after flipflop U8B produces a binary 1 signal from its Q output.

Should the 5 Hz signal cease to be transmitted the binary 1 signal from output pin 4 or 11 of Schmitt trigger U1 would continue for a sufficient time for counter U4 or U5 to produce a binary 1 signal from its Q6 output. This would produce a binary 1 signal from OR gate U7D which would be applied through rectifier RE2 to the reset inputs of flipflops U8A and U8B causing each to produce binary 0 signals at their Q outputs.

The transmission of Manchester encoded data can also be detected by the foregoing arrangement. When this type of data is transmitted at a rate of five bits per second, the transitions between bits occur at half the rate of a 5 Hz signal. With the data being applied to input pin 9 of Schmitt trigger U1, counters U4 and U5 will produce binary 1 signals on its Q4 and Q5 outputs during bit transitions. Thus flipflop U8A and U8B would produce a binary 1 signal on its Q output in the manner previously described by reason of AND gate U6A and U6D producing a binary 1 signal.

It is recognized that the disclosed circuitry would give false indications of the presence of a 5 Hz signal should a frequency below 2.5 Hz that is also a submultiple of 5 Hz be received at the pin 9 input of Schmitt trigger U1. Should such signals be expected they could be filtered out or OR gate U7D and rectifier RE2 could be replaced by two additional type D flipflops, a two input NOR and a two input AND gate.

By connecting the set input of one flipflop to the Q6 output of counter U4 and the set input of the other to the Q6 output of counter U5 each flipflop will be set and will produce an output on its respective Q output upon the production of a binary 1 at its associated Q6 counter output in response to an overcount. Connecting each of these flipflops Q outputs to a different one of the inputs of two input NOR gates cause it to produce a binary 0 at its output whenever either of the flipflops is set. The output of the NOR gate is connected to one input of the two input AND gate whose other input is connected to the outut of OR gate U7C. A binary 1 output from this AND gate thereby indicates the presence of either a 5 Hz signal or Manchester encoded data. The presence of other submultiples of 5 Hz result in a binary 0 at the output of this AND gate.

Resetting of these flipflops is controlled by connecting their respective reset terminals to the outut pins of Schmitt trigger U1, the reset terminal of the flipflop associated with counter U4 to pin 11 and that of the flipflop associated with counter U5 to pin 4. This enables the output AND gate to produce a binary 1 at its output upon the next reception of a 5 Hz or a Manchester encoded signal.

An alternative embodiment has been conceived but is considered less desirable then the described preferred embodiment. This alternative embodiment would employ two one-shot multivibrators to produce a known period signal between their operation. One of these multivibrators would operate in the shortest nominal time of a 5 Hz signal. The other would operate in the longest nominal time. The reception of an incoming pulse in the period between these times would indicate the detection of a 5 Hz signal.

It is understood that variations in the above-described embodiment will be apparent to those skilled in the art and that the embodiment described is for illustrative purposes and is not to be considered limiting.

What is claimed:

1. Apparatus for detecting the presence in a circuit of a plurality of signals including a signal having a predetermined low frequency and a signal with half the frequency of said predetermined low frequency signal, said apparatus comprising, signal generating means generating a signal of a known frequency; and detection signal means connected to said signal generating means and said circuit for producing a detection signal, said detection signal means producing said detection signal in response to receiving both an output signal from said signal generating means and a signal from said circuit indicating the end of a half cycle of either said predetermined low frequency signal or said signal having half said predetermined low frequency.

2. Apparatus according to claim 1, wherein said signal generating means generates a signal of a known frequency higher than that of said predetermined low frequency signal and includes frequency responsive means receiving said known frequency signal, said frequency responsive means being connected to said circuit and producing an output signal in response to the generation of a given number of cycles of said higher frequency signal during one-half of a cycle of said predetermined low frequency signal;

said detection signal means being connected to said frequency responsive means and said circuit producing a detection signal in response to an output signal from said frequency responsive means and a signal indicating the end of said half cycle of said predetermined low frequency signal.

3. Apparatus according to claim 2, wherein said signal generating means is an oscillator and said frequency responsive means includes a first binary counter counting the number of cycles of said known frequency during the first half of each cycle of said predetermined low frequency signal, the frequency of said known frequency being selected in relation to that of said predetermined low frequency signal that at the end of any first half cycle of said predetermined low frequency signal certain of the outputs of said first binary counter produce the output signal of said frequency responsive means.

4. Apparatus according to claim 3, wherein said frequency responsive means includes a second binary counter counting the number of cycles of said known frequency during the second half of each cycle of said predetermined low frequency signal, certain of the outputs of said second binary counter producing the output signal of said frequency responsive means at the end of any of the second half cycles of said predetermined low frequency signal.

5. Apparatus according to claim 4, wherein if either of said counters receives said signal having a frequency of one-half of that of said predetermined low frequency signal instead of said low frequency signal, it produces output signals indicating the reception of said half frequency signal.

6. Apparatus according to claim 5, wherein if said detection signal means receives said half frequency signal instead of said predetermined low frequency one when one of said counters is indicating the reception of said half frequency signal said detection signal means produces a detection signal.

7. Apparatus according to claim 5, wherein if either of said counters receives a signal having a frequency below said half frequency it produces an output signal which prevents said detection signal means from operating to produce a detection signal.

8. Apparatus according to claim 7, wherein said detection signal means includes a first multivibrator connected to said first counter and a second multivibrator connected to said second counter each multivibrator producing said detection signal during the half cycle of said predetermined low frequency signal associated with the counter to which the other multivibrator is connected, both said multivibrators being reset to prevent either from producing said detection signal upon either counter receiving a signal having a frequency below said half frequency.

* * * * *